(12) United States Patent
Yializis et al.

(10) Patent No.: US 9,165,717 B1
(45) Date of Patent: Oct. 20, 2015

(54) HIGH-SURFACE CAPACITOR ELECTRODE

(71) Applicant: SIGMA LABORATORIES OF ARIZONA, LLC, Tucson, AZ (US)

(72) Inventors: Angelo Yializis, Tucson, AZ (US); Gordon Goodyear, Tucson, AZ (US); Vladimir Gordyienko, Tucson, AZ (US); Marlowe Engquist, Tucson, AZ (US)

(73) Assignee: SIGMA LABORATORIES OF ARIZONA, LLC, Tucson, AZ (US)

( * ) Notice: Subject to any disclaimer, the term of this patent is extended or adjusted under 35 U.S.C. 154(b) by 0 days.

(21) Appl. No.: 13/753,637

(22) Filed: Jan. 30, 2013

Related U.S. Application Data

(60) Provisional application No. 61/593,490, filed on Feb. 1, 2012.

(51) Int. Cl.
| | |
|---|---|
| *B05D 5/12* | (2006.01) |
| *H01G 9/048* | (2006.01) |
| *H01G 13/00* | (2013.01) |
| *C23C 14/24* | (2006.01) |
| *C23C 14/32* | (2006.01) |
| *C23C 14/04* | (2006.01) |
| *C23C 14/30* | (2006.01) |
| *C23C 14/28* | (2006.01) |
| *C23C 14/26* | (2006.01) |
| *B05D 3/00* | (2006.01) |

(52) U.S. Cl.
CPC ............... *H01G 9/048* (2013.01); *C23C 14/04* (2013.01); *C23C 14/243* (2013.01); *C23C 14/246* (2013.01); *C23C 14/325* (2013.01); *H01G 13/00* (2013.01); *B05D 3/00* (2013.01); *B05D 5/12* (2013.01); *C23C 14/26* (2013.01); *C23C 14/28* (2013.01); *C23C 14/30* (2013.01); *C23C 14/32* (2013.01)

(58) Field of Classification Search
USPC .................. 427/79–81, 124; 29/25.03, 25, 41, 29/25.42
See application file for complete search history.

(56) References Cited

U.S. PATENT DOCUMENTS

| | | | | |
|---|---|---|---|---|
| 4,309,810 | A | | 1/1982 | Drake |
| 4,842,893 | A | * | 6/1989 | Yializis et al. ............... 427/497 |
| 5,097,800 | A | * | 3/1992 | Shaw et al. .................. 118/730 |

(Continued)

FOREIGN PATENT DOCUMENTS

JP 03-202462 * 9/1991

*Primary Examiner* — Brian K Talbot
(74) *Attorney, Agent, or Firm* — Yakov Sidorin; Quarles & Brady LLP; Antonio R. Durando

(57) ABSTRACT

A high surface area valve-metal capacitor electrode is formed on a moving substrate in vacuum by a continuous multilayer vapor-phase deposition process under conditions of substrate temperature and speed that produce continuously growing, uninterrupted dendritic structures. The process is carried out in an atmosphere of inert gas, preferably including He or Ar, with or without an impurity gas such as oxygen. The substrate may be a valve-metal foil or wire, a metal screen, a polymer film, an organic or inorganic fiber, or a composite material. The direction of motion of the moving substrate may be reversed during the deposition process in order to increase the porosity of the dendrites. The electrode may be passivated using an oxygen-containing plasma before exposure to air. The process may also be carried out under conditions that produce boundary-layer turbulence in order to promote the continuously growth of uninterrupted dendritic structures.

21 Claims, 4 Drawing Sheets

(56) References Cited

U.S. PATENT DOCUMENTS

| | | |
|---|---|---|
| 5,431,971 A | 7/1995 | Allegret et al. |
| 5,482,743 A | 1/1996 | Allegret et al. |
| 6,106,627 A * | 8/2000 | Yializis ............... 118/724 |
| 6,184,324 B1 * | 2/2001 | Benz et al. ............ 526/310 |
| 6,452,783 B1 * | 9/2002 | Chiavarotti et al. ....... 361/508 |
| 7,404,887 B2 | 7/2008 | Katsir et al. |
| 7,709,082 B2 * | 5/2010 | Katsir et al. ............ 428/315.9 |
| 7,807,232 B2 * | 10/2010 | Yializis et al. ............ 427/535 |
| 2006/0117988 A1 * | 6/2006 | Mikhael et al. ............ 106/1.05 |
| 2011/0002088 A1 | 1/2011 | Aoyama et al. |
| 2012/0003449 A1 * | 1/2012 | Yializis et al. ............ 428/213 |

\* cited by examiner

HIGH-SURFACE CAPACITOR ELECTRODE

RELATED APPLICATION

This application is based on and claims the priority of U.S. Provisional Application Ser. No. 61/593,490, filed on Feb. 1, 2012.

BACKGROUND OF THE INVENTION

1. Field of the Invention

This invention is related in general to high-surface-area electrodes for capacitor applications. In particular, the invention relates to valve metal electrodes produced by vapor-phase deposition on various substrates in a high-surface-area dendritic form. Substrates include thin valve-metal foils, valve-metal screens, fibers, and polymer films. A multilayer high-speed electrode formation process is used that results in high-surface-area electrodes with high capacitance per unit volume of coating. Such electrodes are anodized inline to form a metal oxide dielectric, a liquid or polymer electrolyte is added, and they are then packed to form a capacitor for various electrical and electronic applications.

2. Description of the Related Art

Aluminum and other valve-metal electrolytic capacitors are usually produced by etching a metal foil to produce a high-surface area and then by anodizing the etched foil to create a metal-oxide dielectric. For a given dielectric thickness, the etching process and the thickness of the aluminum foil determine the resulting capacitance per unit volume. An alternative method is by depositing a high-surface-area porous valve-metal coating on a valve-metal foil and then processing the coated foil much like an etched foil.

When depositing thin films and in particular polycrystalline metal films on a substrate, the film growth and the resulting crystalline structure can be separated into different growth stages. The first phase is a crystal-nucleation stage, where atoms arriving on the substrate are reactively trapped by potential wells or condense on the substrate to form small individual crystals. During this stage the deposited atoms diffuse and bounce on the substrate surface until they condense or react with the substrate. The next growth phase is a crystal-growth stage, during which the deposited atoms grow crystals on the nucleated sites. The next stage represents grain growth by coalescence and by abnormal grain growth due to grain migration. The final growth phase as the thickness of the film increases is a segregation phase induced by process conditions, impurities and additives, all of which produces clearly distinct phases normally referred to in the art as dentritic structures. Because of their large surface area per unit volume, such structures represent the ultimate goal of crystal growth for electrolytic capacitor applications.

When depositing valve metals such as aluminum, the formation of dentritic structures is promoted by high temperatures and the presence of impurities; otherwise, the metal layer does not acquire the large-area configuration necessary for useful capacitor applications. Different dimensional segregates can be formed by varying the temperature of the substrate and a model for substrate temperature dependence proposed by B. A. Movchan and A. V. Demchishin (1969) describes three phases of segregates. A columnar highly segregated structure formed at temperatures below $0.2\,T_m$ (where $T_m$ is the melting temperature of the bulk deposited material), followed by a second phase at temperatures between $0.2\,T_m$ and $0.5\,T_m$ where the grain growth forces the columns to coalesce, and another higher temperature zone where additional grain growth opens the grain boundaries further resulting in a larger fully coalesced crystal structure. A transition zone between $0.1\,T_m$ and $0.2\,T_m$, added to the model by Thornton Grovenor at al. and Messier et al., also takes into account ambient pressure. Impurities and additives are two parameters that also have a significant effect on the structure of a coating. In the case of aluminum coatings that are of particular interest to this invention, Barna and Adamik have shown that an impurity such as oxygen may be used to disrupt the aluminum atom diffusion and coalescence, leading to disruption of grain boundary growth, resulting in a rough surface coating. The degree of disruption of the normal growth is shown to depend on the ratio of impurity molecules to depositing molecules on the surface of the growing film. Such coatings become increasingly porous as they get thicker, leading to a high surface-area aluminum layer. Therefore, one can use such micro-structured aluminum (or other valve metal coatings) to produce high surface-area capacitors by anodizing the coating to form an aluminum oxide and then introducing a liquid or polymer electrolyte with a counter electrode.

U.S. Pat. No. 4,309,810 teaches a method for producing such micro-structured aluminum coatings for use in electrolytic capacitor applications by evaporating aluminum in the presence of an oxygen impurity. U.S. Pat. No. 5,431,971 and U.S. Pat. No. 5,482,743 teach a similar process on a plate or a roll of aluminum foil, using various mixtures of oxygen that result in a micro-structured deposit that has certain levels of atomic aluminum metal and oxygen. U.S. Pat. No. 7,404,887 and U.S. Pat. No. 7,709,082 teach a similar coating structure for a valve metal such as aluminum using oxygen as impurity, referring to it as a cauliflower and fractal structure. A series of Japanese patents, the latest of which is PAJ245066, teaches a similar structure with defined $Al/O_2$ ratios, referring to it as a columnar structure or fine particles; and U.S. Patent Publication No. 2011/0002088, related to PAJ 288296, teaches a similar aluminum coating structure with defined $Al/O_2$ ratios, referring to the structure as frost pillars and aquatic plants. Other descriptions of this aluminum dendritic growth include tree structures, porous layers, and grain agglomerates.

In all prior art cases what is described is a coating of micro-structured or nanostructured dendritic aluminum coating that has a thickness of a few microns to several tens of microns. Given the thickness of the aluminum coating, during the coating process the temperature of the substrate is necessarily elevated to temperatures in the order of 300° C. or higher, which are in the order of $0.5\,T_m$ or higher for aluminum. Based on the three-zone growth model, at such temperatures the structure of the coating is a dense one, void of fractal, dendritic or porous character. In order to induce a certain level of porosity, Barna and Adamik show that an impurity such as oxygen (other reactive gases also work) is necessary to limit grain growth. The substrate/coating temperature increases as the thickness of the coating increases, which can change the porosity of the coating as a function of thickness. U.S. Pat. No. 7,709,082 teaches a process where after some thickness of coating is deposited on an aluminum foil the process is stopped and repeated after a time period in order to produce discontinuous dendritic structures and thus enhance porosity and capacitance. The thickness of the aluminum foil substrates used in the prior art work is at least 25 microns or higher. A key limitation in using thinner foils is the strength of the foil at the high process temperature. When a coating of the order of a few microns is deposited on a thinner foil, the combined effect of the heat of condensation and to some extent the exothermic reaction in the presence of the oxygen impurity heats the foil substrate and weakens foil strength causing it to break, deform or melt. Therefore, there is a need for a low-temperature process that enables the formation of continuously growing, uninterrupted, dendritic structures dendritic structures, especially over large-area substrates.

Furthermore, in addition to the use of high-surface areas for capacitor applications, there is also a well-established need for utilizing such materials as well for absorbing radiation in the UV, Vis, NIR and FIR spectra, often combined with high thermal conductivity and super-hydrophobic and/or super-oleophobic properties. For example, missile-seeker sensors require reduction of stray light to improve image quality; cooled and uncooled IR detectors require IR absorbing materials with low outgassing and cryogenic compatibility; remote sensing of targets requires high/low emissivity coatings; mobile and stationary platforms need to passively dissipate heat from low-emissivity flat metal surfaces; IR optical systems, thermal cameras, conventional cameras, UV photolithographic optics, pyroelectric sensor arrays, space telescopes, endoscopes, etc, all require parts to suppress ghost images, trap light (sometimes down to a few photons) and passively dissipate heat. Therefore, there is a need for a surface modification process applicable to a wide range of materials that can combine several distinct functionalities, including broad spectrum radiation absorption, thermal transfer, color in the Vis spectrum and variable refractive index coatings, into a singular multifunctional surface treatment.

SUMMARY OF THE INVENTION

This invention provides solutions to several problems that exist in the prior art and creates an opportunity for producing capacitors with higher capacitance and energy density. Specifically, a new low substrate temperature deposition process is developed for which an oxygen impurity is not required to control grain boundary growth, valve metal foil substrates of any thickness can be used as substrates (thereby enhancing capacitor energy density), the coatings are corrosion stabilized to maximize capacitance, and highly porous coatings of any thickness can be formed on any substrate without concerns for heat of condensation effects and surface boundary layer effects (resulting from moving the substrate at high speed), all of which increases the porosity of the dendritic film growth and enhances surface area and capacitance per unit volume of coating.

According to one aspect of the invention, a high surface area valve-metal capacitor electrode is formed on a moving substrate in vacuum by a continuous multilayer vapor-phase deposition process under conditions of substrate temperature and speed that produce continuously growing, uninterrupted dendritic structures. The process is carried out in an atmosphere of inert gas, preferably including He or Ar, with or without an impurity gas such as oxygen. The substrate may be a valve-metal foil or wire, a metal screen, a polymer film, an organic or inorganic fiber, or a composite material. The direction of motion of the moving substrate may be reversed during the deposition process in order to increase the porosity of the dendrites.

According to another aspect, the high surface area valve-metal capacitor electrode of the invention is formed on a moving substrate in vacuum by a continuous multilayer vapor-phase deposition process under conditions that produce continuously growing, uninterrupted dendritic structures at a substrate temperature less than $0.2\,T_m$, where $T_m$ is said valve-metal's melting point. The same options of ambient atmosphere composition, substrate materials, and directional reversals during deposition apply.

In all cases the electrode may be passivated using an oxygen-containing plasma before exposure to air. The process may also be carried out under conditions that produce boundary-layer turbulence in order to promote the continuously growth of uninterrupted dendritic structures. The capacitor electrode is preferably used to produce a capacitor, but other functionalities may be incorporated into the dendritic structure for different applications, such as the absorption of radiation in the UV, Vis and IR spectra and/or super-hydrophobic and oleophobic properties.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DETAILED DESCRIPTION OF THE PREFERRED EMBODIMENT

Figure 1:
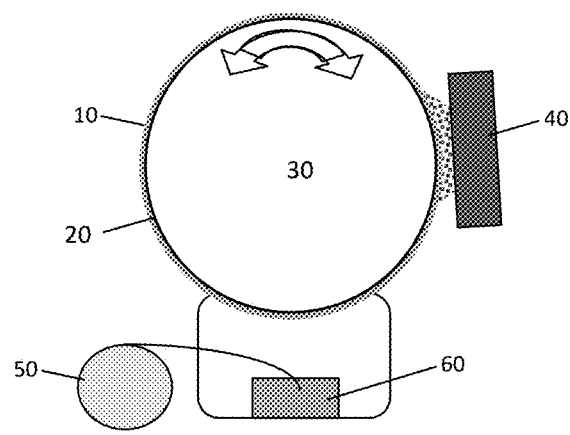
FIG. 1 is a schematic representation of the equipment used to produce dendritic aluminum coatings according to the process of the invention.

FIG. 1 shows a schematic configuration of the apparatus used to produce dendritic aluminum coatings according to the invention. In the prior art structured aluminum coatings have been produced using a flat plate substrate or a roll-to-roll coating system. In both cases thick aluminum coatings are deposited that become porous using an oxygen impurity. Instead of such substrates, according to the present invention a large process drum 30 is used that can rotate in both direction at surface speeds of 1000 feet per minute or more. The temperature of the process drum is controlled using a heated/chilled liquid. A valve metal 50, such as aluminum in wire form, is fed into one or more resistively heated evaporation sources 60. The evaporation source may also be in the form of an electron beam heated crucible. The process drum is wrapped with a substrate 20 of a foil such as aluminum, an aluminum screen, a polymer film or a composite material. A plasma reactor 40 is placed against the process drum. The rector may be in the form of a magnetron, or a hollow cathode, and it may be powered by DC or AC voltage. The process starts by rotating the drum at some predetermined speed. The high rotational speed of the drum allows only a small amount of metal to be deposited per unit time. The heat of condensation of such low quantity of aluminum is such that virtually any substrate can be used to form a thick dendritic aluminum coating without any thermal degradation effects. The temperate of the substrate can be well below 100° C. The high rotational speed of the drum allows thick layers to be formed quickly and economically even when compared to a roll-to-roll coating process.

The substrate temperature under the above described conditions causes the coating structure to fall in the <0.2 $T_m$ range, which produces a columnar growth with individually growing columns without the need for an oxygen impurity. Based on this, the dendritic structure and porosity of the coating can be controlled using an inert gas such as Ar or He. The plasma reactor may be used during or after the deposition of the coating. When using a plasma with an inert gas such as argon during the deposition process, the coating can be densified as a function of plasma power. When using a plasma with an impurity type gas such as oxygen, an oxide is produced on the surface of the forming grains which can improve the dendritic growth. This may be performed at every revolution of the drum or periodically after a certain number of revolutions.

An even more interesting effect is obtained by exposing the dendritic coating to an oxygen plasma after completion of the coating process. U.S. Pat. No. 7,807,232 teaches that thin aluminum films, if not passivated in a vacuum environment, form a hydrated aluminum oxide that accelerates their corrosion process. A similar behavior was observed in this invention. As shown in Table 1 below, both the initial capacitance and the capacitance after anodization are affected by exposure to an oxygen plasma. As shown, brief exposure to such plasma improves the corrosion stability of the nanosized aluminum particles on the dendrites after exposure to ambient conditions of humid air, while longer exposures causes oxidation of the nanoparticles and loss of conductive surface area.

Table 1. Dendritic aluminum coatings on an aluminum foil with exposure to plasma after the coating process and before exposure of the coating to air, showing capacitance of equal area samples before and after anodization at 3V.

TABLE 1

Dendritic aluminum coatings on an aluminum foil with exposure to plasma after the coating process and before exposure of the coating to air, showing capacitance of equal area samples before and after anodization at 3 V.

| Exposure to $O_2$ Plasma (sec) | Initial Capacitance (mF) | Capacitance after 3 V Anodization |
|---|---|---|
| No Plasma | 3.3 | — |
| 10 | 4.2 | 1.1 |
| 30 | 4.5 | 2.25 |
| 60 | 3.2 | 1.64 |
| 300 | 3.6 | 1.33 |
| 1500 | 2.7 | 0.77 |

In all examples outlined below the dendritic coatings were oxygen-plasma passivated insitu before removal from the vacuum chamber. Also all substrates used in this work were first exposed to a plasma to etch and clean the surface from organic and inorganic contaminants.

The benefits of high-speed substrate movement are demonstrated in the following example. A rotating process drum was used with multiple wire-fed aluminum evaporation sources placed below it. The deposition was performed on aluminum foils with two different thicknesses on the drum surface; one with a thickness of 25 micrometers and one with a thickness of 6 micrometers. The process chamber was first evacuated to a pressure of $10^{-4}$ torr and argon was injected into the chamber to maintain a pressure of $8 \times 10^{-2}$ torr. In one experiment the surface speed of the drum was 10 ft/min, which would be typical of prior-art processes, and in another experiment the drum speed was set at 500 ft/minute. After depositing a coating of dendritic aluminum, 20 microns thick, using equal deposition rates and equal deposition times, the following observations were made: at 10 ft/min the 6 micron thick aluminum foil was deformed and partially melted and the capacitance on the 25 micron aluminum was 0.50 mF; at 500 ft/min the 6 micron thick aluminum was not affected and the capacitance on both aluminum foils was 4.71 mF. This is far from optimum for a 20 micron thick coating, but nevertheless this experiment showed that: a) when depositing aluminum at high deposition rates, the heat of condensation is too high to allow the use of thin aluminum foils (note that thin foils are useful because they have a significant impact on the energy density of capacitors produced using dendritic aluminum coatings); b) at high surface speeds the temperature of the substrate is approximately 100° C., which is below 0.2 $T_m$ and an impurity like oxygen is not necessary to produce dendritic coatings; c) high rotational speeds create a continuous and uninterrupted dendritic growth typical of a continuous deposition process. This is a significant discovery because the rotational process allows for a low substrate temperature without preventing the discontinuation of dendritic growth, which is necessary to produce a high surface area electrode.

In addition to the lower substrate temperature, we found that the growth characteristics of the coating can be affected by a change in the direction of the moving substrate. We have discovered that when a valve metal like aluminum is deposited at relatively high pressure, that is, at pressures in the range of 0.001 to 1 torr, the high speed substrate movement resulting from the high rotational speed leads to dendrites with different growth characteristics. This appears to be due to a boundary layer of gas moving close the surface of the growing dendrites, which statistically influences the way in which the atoms attach to the moving surface and thus the growth of the grain boundaries. Collisions between the relatively large argon gas molecules and the aluminum atoms causes them to deposit preferentially on protruding points on the growing coating, thus increasing the degree of substrate roughness and porosity, which is directly related to the capacitance of the dendritic growing electrodes.

Figure 2:
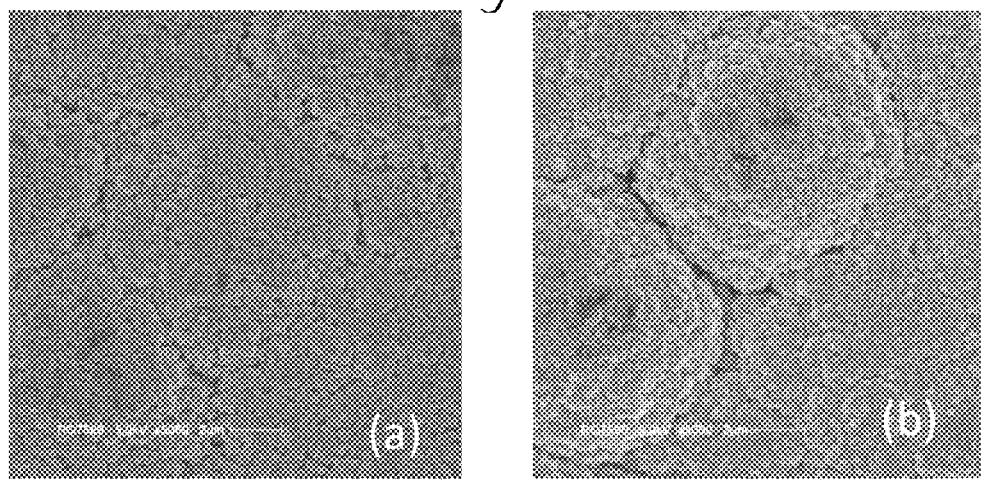
FIG. 2 illustrates the difference in dendritic formations produced according to the invention at drum speeds of 100 ft per minute, in 2(a), and at 800 ft/min, in 2(b), the latter showing noticeably improved separation between the dendrites.

An example of the combined effect resulting from high surface movement of the substrate is demonstrated by an experiment where two dendritic coatings are produced under identical conditions but different surface speeds. Aluminum dendritic coatings were produced on an aluminum foil substrate at a pressure of 0.28 torr of Ar gas using a multisource evaporation aluminum wire fed from sources with identical deposition rates for a period of 10 minutes. One deposition was conducted at a surface speed of 100 ft/min and the other at 800 ft/min. The capacitance of the two coatings measured on a 10 square centimeter area was respectively 6.1 mF and 7.6 mF, showing that higher surface area coatings can be obtained at higher surface speeds. As shown in FIG. 2, the coating 2(*b*) produced at 800 ft/min has dendrites that protrude higher from the surface of the coating, with noticeably improved separation between them than seen in coating 2(*a*), which was produced at 100 ft per minute.

Figure 3:
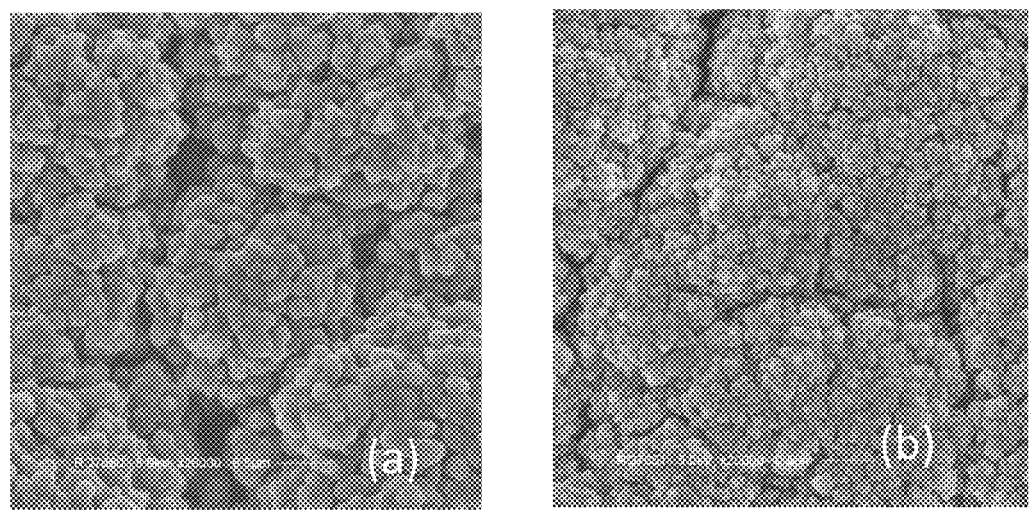
FIG. 3 illustrates the effect of deposition drum speed on the size of the nanoparticles of the dendrites formed according to the invention, the ones produced at the lower speed of 40 ft/min having much larger nanoparticles, seen in 3(a), than those of the coating shown in 3(b) produced at 500 ft per minute.

In another example the effect of substrate surface movement was demonstrated using helium gas. Aluminum dendritic coatings were produced on an aluminum foil substrate at a pressure of 0.28 torr of He gas using a multisource evaporation aluminum wire fed from sources with identical deposition rates for a period of 3 minutes. One deposition was conducted at a surface speed of 40 ft/min and the other at 500 ft/min. The capacitance of the two coatings measured on a 10 square centimeter area was respectively 3.1 mF and 4.0 mF, showing that higher surface area coatings can be obtained at higher surface speeds. As shown in FIG. 3, the coating seen in 3(*a*) produced at 40 ft/min has much larger nanoparticles than those of the coating seen in 3(*b*) produced at 500 ft per minute. The He gas having a smaller atomic mass is expected to have a reduced boundary layer effect, while the temperature effect will also be less. The larger grains in the dendritic coating at the lower surface speed also indicate that the temperature of the coating is higher than at higher surface speeds, as expected.

The effect of surface speed is not only evident at higher pressures using an inert gas environment, but also at lower pressure with an $Ar/O_2$ gas mixture, which is used by most of the prior-art processes to produce micro structured aluminum coatings for capacitor applications. Two coatings were produced at an ambient pressure of $8.3 \times 10^{-3}$ torr using an $Ar/O_2$ gas mixture with an $Ar/O_2$ gas flow rate ratio of 3/7. The chamber was first evacuated to a pressure of $10^{-4}$ torr and the Ar/O2 gas mixture was introduced into the chamber until the pressure was stabilized at $8.3 \times 10^{-3}$ torr. Multiple aluminum wire fed evaporation sources were used to deposit a coating at identical conditions for 20 minutes. Two coatings were produced under these conditions, one at 100 ft/min and the other at 900 ft/min. The corresponding capacitances of the coatings were 7.4 mF for the 100 ft/min sample and 13.5 mF for the 900 ft/min sample.

Figure 4:
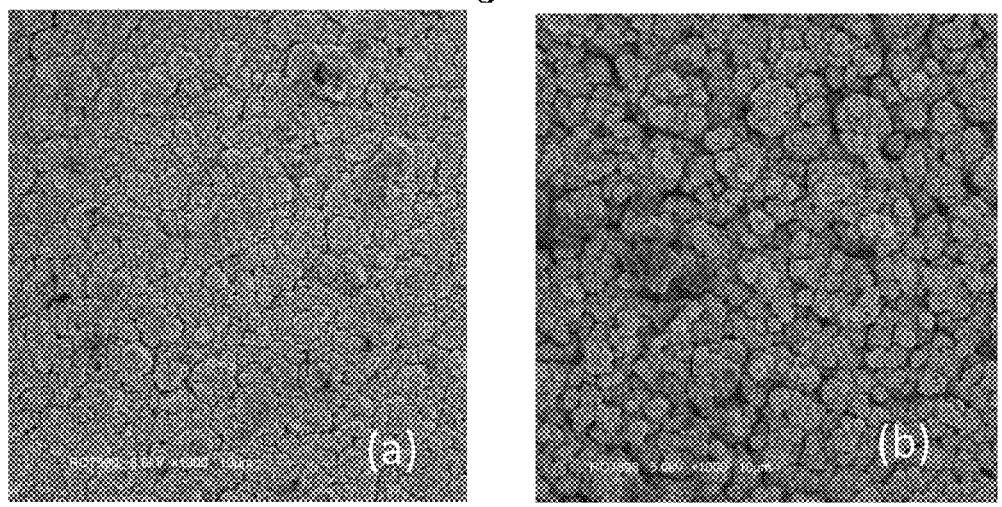
FIG. 4 illustrates the effect of direction reversal during the deposition process; the characteristic 3D surface produced by high-surface speeds in one-directional coating is seen in 4(a), while 4(b) shows that the direction reversal produces a higher level of three dimensionality as well as higher porosity.

The density of the coating is a key parameter in determining the capacitance of a dendritic electrode after anodization at some voltage level. Regardless of the surface area and the initial capacitance of a coating, if the density of the coating is too high, during the anodization process the formation of aluminum oxide increases the density of the coating, which reduces access of the surface area by the liquid electrolyte (or polymer electrolyte/conductor), which minimizes the capacitance and thus the overall energy density of the foil/dendritic electrode system. After determining that the high surface speed affects the grain boundary growth, experiments were conducted to determine the effects of changing the direction of motion. In the following example, two dendritic coatings were formed at an Ar-based pressure of 0.28 torr using the same aluminum evaporation rate from a multi-wire fed aluminum evaporation source. In one case the complete dendritic coating was produced in 9 minutes while the drum was rotating in one direction, and in the other case the drum rotating with a surface speed of 900 ft/min changed the direction of rotation every 1.5 min, that is, six times during a total run time of 9 min. The capacitance of the two coatings measured on a 10-cm$^2$ area was 7.60 mF for the coating produced in a single direction and 7.65 mF for the coating produced with six direction reversals. After anodization at 3V, the two coatings had a corresponding capacitance of 3.50 mF and 4.03 mF, respectively, suggesting that although both coatings had the same initial surface area the coating generated with direction reversals had a lower density, thus allowing the electrolyte to reach a greater surface area in the coating that was densified by the anodization process. FIG. 4 shows images of the surface of the two coatings. FIG. 4(*a*) shows the one-directional coating with the characteristic 3D surface produced by the high surface speed, while FIG. 4(*b*) shows that the direction reversal produced a higher level of three dimensionality and higher porosity. Based on the initial capacitance values of the two coatings, the reversing process caused some aluminum to be deflected away from the growing surface, resulting in a coating that has the same surface area with a lower density. Upon anodization, the lower density coating resulted in a higher capacitance, suggesting that for a given coating thickness conditions need to be developed to optimize the coating density for a given anodization voltage.

Hundreds of experiments were conducted to identify a set of conditions that produce the maximum surface area at a minimum coating thickness, varying parameters such as ambient pressure, aluminum deposition rate, gas mixture, point at which the gas is injected into the chamber with regard to the aluminum evaporation zone, cooling temperature of the process, drum surface speed, and different substrates varying from foils to polymer films and metal screens. We found that the set of conditions leading to maximum capacitance after anodization is not a unique set. That is, different sets of conditions exist that lead to the same result. For example, if we fix the surface speed at 900 ft/min, using Ar gas we can produce virtually identical coatings at 0.14 torr and 0.28 torr by increasing the aluminum deposition rate by 50%. If the aluminum deposition rate is not increased, an increase in pressure will increase the number of collisions between the aluminum atoms and the Ar molecules resulting in a coating with lower thickness, higher porosity, and larger nanoparticles at the tips of the dendrites. Such coating will have poor mechanical strength and will be susceptible to damage when processed into a capacitor. Changing the process gas to a lower atomic mass inert gas such as He and fixing the surface speed and ambient pressure requires a reduction in the aluminum evaporation rate because the number of collisions with the aluminum atoms is decreased and the kinetic energy of an atom after a collision is proportionally higher, all of which will lead to a denser coating if the aluminum evaporation rate is not decreased. Similarly, if an impurity such as $O_2$ is used, for a given surface speed either the ambient pressure has to be decreased to control the degree of oxidation of the coating or the aluminum deposition rate has to be increased (or both).

The uniqueness of the invention's high surface process is that the substrate temperature, which is a dominant factor in influencing grain growth, is removed from the equation and instead surface speed is introduced as a parameter that can be easily controlled under any condition. Therefore, if coatings of different thicknesses are required, once the optimum process conditions are identified, the process time is increased proportionally to obtain the desired thickness, with no concern that the added heat load associated with higher thicknesses will change the grain growth characteristics.

Figure 5:
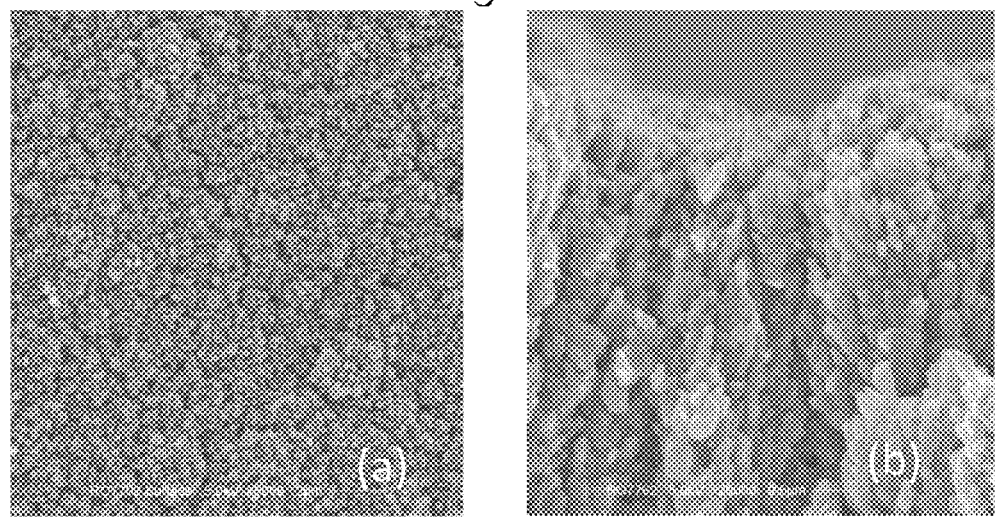
FIG. 5 illustrates that substantially the same dentritic structures were obtained by depositing a coating with a total thickness of 12 micron on both 25-micron and 6-micron thick aluminum foils, illustrated in the image from the surface of the layer, in 5(a), and in cross section, in 5(b).

The high process speed allows for much thinner aluminum foil substrates to be used, which improves the capacitor energy density. For example, a dendritic coating was formed using an Ar environment at a pressure of 0.14 torr at a surface speed of 500 ft/min. A coating with a total thickness of 12 micron was formed both on 25 micron and 6 micron thick aluminum foils, producing substantially the same dentritic structure in both cases. FIG. 5(*a*) shows the structure of the resulting dendritic coating as seen from the surface of the layer and 5(*b*) shows a cross section of the dendrites. One can see that although the 12 micron layer was formed with 100s of revolutions of the process drum, the dendrites are continuous and uninterrupted. Unlike the strata described in U.S. Pat. No. 7,709,082, where multiple layers of coating produced a discontinuity between the layers that improved porosity, the dendrites in this process consist of a single thick layer coating without discontinuities. The initial capacitance on 10 sq.cm samples was 6.4 mF and after anodization at 11V and 3V the capacitance was respectively 1.2 mF and 2.9 mF. Not taking into consideration any other capacitor elements such as polymer electrolyte, electrodes, packaging, etc, the CV to volume ratio doubled with the use of the thin aluminum foil, as shown in Table 2 below.

Table 2. Capacitance-times-Voltage (CV) product to volume ratio of a 12 micron thick dendritic coating formed on 25 micron and 6 micron thick foils for 11V and 3V anodizing voltages.

TABLE 2

Capacitance-times-Voltage (CV) product to volume ratio of a 12 micron thick dendritic coating formed on 25 micron and 6 micron thick foils for 11 V and 3 V anodizing voltages.

| Anodization Voltage | CV/cc - 25 µm Al Foil | CV/cc - 6 µm Al Foil |
|---|---|---|
| 11 V | 0.36 | 0.73 |
| 3 V | 0.24 | 0.48 |

These results demonstrate one of the advantages of the high surface speed dendritic formation process; that is, the ability to use thin foils to form dendritic coatings leads to a significantly larger capacitance-voltage product per unit volume.

In another example the aluminum foil substrate was replaced with a metallic screen. Unlike a flat foil substrate, the screen allows deposition at an angle without using a deposition source that is placed at an angle with respect to the substrate (as taught by U.S. Pat. No. 4,309,810). A screen is impractical to use with a high-temperature process because it makes point contacts with the cooled substrate and the temperature across the screen will be non-uniform. Even in the presence of an oxygen impurity, this will result is a variable coating porosity on the wires comprising the screen material, leading to variable capacitance based on contact with the substrate. However, the relatively "cold" process of the invention is uniquely suited for the use of a substrate such as a screen or fibers. The process of the invention takes advantage of the curved areas of the screen material to create angular deposits that have higher dendritic structures without the higher temperature effects that decrease porosity and electrode surface area. In one example a dendritic coating was produced simultaneously on four different substrates, a foil and three different screens that had different size wires and varied in weave density from a coarse weave to a tight weave. The coating was produced at 100 ft/min and an argon pressure of 0.28 torr. The initial capacitance of a 10 sq.cm. area of coated substrate was 3.7 mF for foil, 5.4 mF for coarse weave screen, 7.0 mF for medium weave screen, and 8.2 mF for tight weave screen. This clearly shows that the electrode surface area was higher on the screens that on the aluminum foil.

Figure 6:
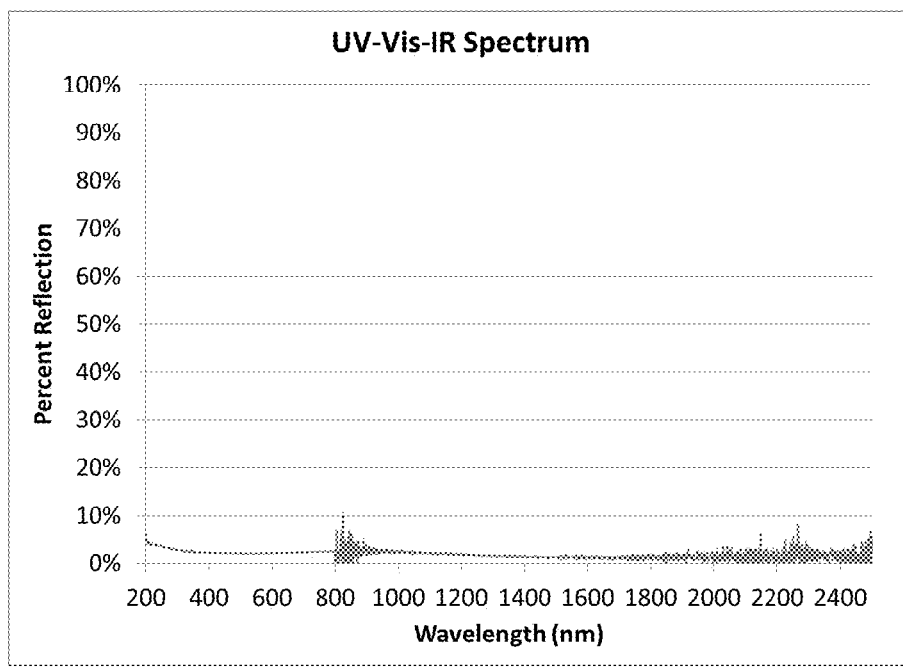
FIG. 6 shows the radiation absorption of a dendritic coating produced according to the invention in order to test the material for UV, Vis and IR absorption.

A dendritic coating was also produced and tested for radiation absorption properties. Dendritic aluminum was deposited on an aluminum foil substrate, moving at a speed of 500 ft/min, in a partial Ar atmosphere of 0.14 torr. A dendritic coating with a thickness of 44 microns was produced and tested for UV, Vis and IR absorption. FIG. 6 shows the absorption (measured as reflection) performance of this material, which appeared visually black and is shown in the figure. We also found that such dendritic surfaces with or without anodization are very hydrophilic (and oleophilic), which may be useful for evaporative cooling applications. However, because in general hydrophilic coatings are subject to contamination and fouling, the dendritic surface so produced can be rendered not only effectively self-cleaning but also super-hydrophobic and oleophobic by injecting reactive fluoro monomers onto the dendritic surface as a vapor at supersonic speed. By so treating the black coating of this example (shown in the photograph inserted in the graph of FIG. 6), a high temperature polymer layer 10-50 nm thick was formed on the dendritic structure. A 10 ml water drop on the surface of the treated black coating had a contact angle>170 degrees, showing that the surface had become super-hydrophobic (defined by a contact angle>150 degrees).

While the invention has been shown and described herein in what is believed to be the most practical and preferred embodiments, it is recognized that departures can be made therefrom within the scope of the invention. For example, the invention has been described in terms of an aluminum valve metal, but other valve metals such as titanium, tantalum, niobium, tungsten, zirconium and composites of two or more such metals may be used. Examples of foil and screen substrates are presented but other conducting and insulating substrates may be used, such as polymer films, metallized polymer films, fiber glass and metallized fiberglass fabrics, laminates, composites, etc. Similarly, the invention has been described primarily in terms of depositing a dendritic coating on a rotating drum, which is preferred, but it is understood that other substrates such as endless tape, or a large flat disc may be used. Furthermore, although the experimentation was limited to substrate surface speeds of 900 ft/min, this was an equipment limitation and improvements in dendritic surface area as a function of surface speed are expected to continue at substrate speeds of several 1000s of feet per min. The principal application for the high surface area dendritic electrode is capacitors, however the same material may be used in other applications, including solar heat absorbers, and heat sinks. Thus, the invention is not to be limited to the details disclosed herein but is to be accorded the full scope of the claims so as to embrace any and all equivalent processes and products.

What is claimed is:

1. A method for fabrication of a high-surface area valve-metal layer, the method comprising:
   continuously rotating a process drum having an axis such that the process drum having an axis such that the process drum completes multiple revolutions about the axis, said process drum carrying a substrate wrapped around the process drum;
   during said continuously rotating, continuously vapor-phase depositing a valve-metal material on the substrate such that a valve-metal material deposited during an Nth revolution is deposited directly onto a valve-metal material that has been deposited during an (N−1)th revolution to form a valve-metal layer having only one stratum and a dendritic structure that grows uninterrupted throughout a cumulative thickness of said valve-metal layer.

2. A method according to claim 1, further comprising maintaining the rotating substrate at a temperature below 0.2 $T_m$, wherein $T_m$ is a melting temperature of the valve-metal material.

3. A method according to claim 1, wherein said continuously rotating includes continuously rotating at a linear speed that exceeds 100 ft/min.

4. A method according to claim 1, further comprising changing a direction of said continuously rotating such that the process drum completes multiple revolutions in an opposite direction of rotation.

5. A method according to claim 1, wherein said vapor-phase depositing includes vapor-phase depositing a valve-metal material in a gas atmosphere devoid of oxygen.

6. A method according to claim 1, wherein said vapor-phase depositing includes vapor-phase depositing a valve-metal material in a gas atmosphere including an inert gas.

7. A method according to claim 1, wherein said rotating includes rotating the substrate that includes one or more of a valve-metal foil, valve-metal wire, a valve-metal screen, a polymer film, a fiber, and a composite material.

8. A method according to claim 1, wherein said vapor-phase depositing includes vapor-phase depositing a valve-metal material to produce, on said rotating substrate, a dendritic coating visually perceivable as black.

9. A method according to claim 1, wherein said vapor-phase depositing includes vapor-phase depositing a valve-metal material to produce, on said substrate, the valve-metal layer characterized by a reflection coefficient of less than 5% within the spectral range between 200 nm and 2500 nm.

10. A method according to claim 1, further comprising forming a capacitor electrode with said valve-metal layer.

11. A method according to claim 1, further comprising forming the valve-metal layer with the cumulative thickness exceeding 1 micron.

12. A method according to claim 9, further comprising propelling a reactive fluoro-containing material onto the valve-metal layer to form a hydrophobic layer thereon, the hydrophobic layer characterized by a water-wetting angle of greater than 150 degrees.

13. A method for fabrication of a high-surface area valve-metal layer, the method comprising:
continuously rotating a substrate, wrapped around a process drum with an axis and having a temperature of less than $0.2\ T_m$, about the axis in a first direction such that the substrate completes multiple revolutions about the axis;
while so continuously rotating, continuously vapor-phase depositing a valve-metal material the substrate such that a valve-metal material deposited during an Nth revolution is deposited directly onto a valve-metal material that has been deposited during an (N−1)th revolution to form a valve-metal layer having a) only one stratum and b) a dendritic structure that grows uninterrupted throughout a cumulative thickness of said valve-metal layer,
wherein $T_m$ is a melting temperature of the valve-metal material.

14. A method according to claim 13, wherein the continuously rotating includes continuously rotating at a linear speed that exceeds 100 ft/min.

15. A method according to claim 13, further comprising changing a direction of rotation of the substrate about the axis to rotate the substrate in a second direction such that the substrate completes multiple revolutions about the axis, wherein the first and second directions of rotation are opposite to each other.

16. A method according to claim 13, wherein said depositing includes vapor-phase depositing a valve-metal material in a gas atmosphere including He or Ar.

17. A method according to claim 13, wherein said vapor-phase depositing includes vapor-phase depositing a valve-metal material in a gas atmosphere including an inert gas and oxygen.

18. A method according to claim 13, wherein said vapor-phase depositing includes producing the valve-metal layer characterized by a reflection coefficient of less than 5% within the spectral range between 200 nm and 2500 nm.

19. A method according to claim 13, further comprising forming a capacitor electrode with said valve-metal layer.

20. A method according to claim 13, further comprising forming the valve-metal layer with the cumulative thickness exceeding 1 micron.

21. A method according to claim 18, further comprising propelling a fluoro-containing material onto the valve-metal layer to form a hydrophobic layer thereon, the hydrophobic layer characterized by a water-wetting angle of greater than 150 degrees.

* * * * *